United States Patent [19]

McDermott et al.

[11] Patent Number: 4,959,561

[45] Date of Patent: Sep. 25, 1990

[54] MOS OUTPUT BUFFER WITH REDUCED SUPPLY LINE DISTURBANCE

[75] Inventors: Mark W. McDermott; Ernest A. Carter, both of Austin, Tex.

[73] Assignee: Motorola, Inc., Schaumburg, Ill.

[21] Appl. No.: 499,569

[22] Filed: Mar. 26, 1990

Related U.S. Application Data

[63] Continuation of Ser. No. 293,245, Jan. 4, 1989, abandoned.

[51] Int. Cl.$^5$ .................. H03K 17/16; H03K 19/017; H03K 5/12
[52] U.S. Cl. .................................. 307/443; 307/448; 307/451; 307/263; 307/270; 307/572
[58] Field of Search ............... 307/443, 448, 451, 270, 307/572, 263

[56] References Cited

U.S. PATENT DOCUMENTS 4,758,743 7/1988 Dehganpour et al. .............. 307/443
4,818,901 4/1989 Young et al. ....................... 307/443

Primary Examiner—Stanley D. Miller
Assistant Examiner—Margaret Rose Wambach
Attorney, Agent, or Firm—Charlotte B. Whitaker

[57] ABSTRACT

An output buffer with reduced supply line disturbance is provided for use in high performance microprocessor circuits. The output buffer uses a resistor and transistor as a sensing circuit, in parallel with an output driver transistor, thereby providing a negative feedback path into the control circuitry for the output driver. The sensing circuit detects the strength of the output driver transistor, by monitoring the amount of capacitance on the output node when the output buffer is driving the output signal to a logic high or logic low state, and rapidly produces a control voltage. The current flowing through the driver transistor and the sensor transistor causes a voltage drop across the resistor, which is fedback into the control circuitry. The control voltage is fed back into the output buffer control circuitry, thereby facilitating the reduction of the current drive capabilities of the driver and sensor transistors. Thus, the control circuitry reduces the change in current flow (di/dt) attributable to the operation of the driver and sensor transistors during the output buffer logic state transition.

9 Claims, 1 Drawing Sheet

MOS OUTPUT BUFFER WITH REDUCED SUPPLY LINE DISTURBANCE

This application is a continuation of prior application Ser. No. 07/293,245, filed Jan. 4, 1989 now abandoned.

FIELD OF THE INVENTION

This invention relates to buffers, and more particularly, to high-speed output buffers for switching large capacitive loads.

BACKGROUND OF THE INVENTION

In integrated circuits, there is generally a piece of silicon known as a die or chip which contains electrical circuits and which is connected to a lead frame. The chip has bonding pads which are connected to the lead frame by tiny wires. The lead frame has leads which are used for connecting to a printed circuit board as part of a larger system. The leads of the lead frame have a certain amount of inductance as well as capacitance and resistance. There is also some inductance in the wire from the bonding pad to the lead frame. The connection of the lead frame to a circuit board also adds some inductance. As the switching speeds of integrated circuits have increased, this cumulative inductance has begun to have an impact on the performance of the integrated circuit.

Generally, it is desirable to have integrated circuits which are very fast. The increased switching speed also increases the rate at which current changes. This increased rate of current change causes a voltage drop across the inductance. The voltage across an inductance is equal to the inductance time the time rate of change of the current through that inductance. This is expressed as LDi/dt, where L is the inductance and di/dt is the time rate of change of the current. As the di/dt becomes larger, the voltage across the inductance becomes larger. Accordingly, the voltage drop across the inductance in the wire connecting the bonding pad to the lead frame causes a voltage differential between the lead location on the circuit board and the bonding pad to which it is connected on the integrated circuit. This can create a problem of having the internal power supply at a different voltage than the voltage of the external supply.

Today's high-performance microprocessors require high speed output buffers capable of switching large capacitive loads. Typically, a CMOS output buffer uses a P-channel pull-up transistor and an N-channel pull-down transistor, coupled to an output terminal, for providing an output signal which is a function of the data received from the other logic circuitry of the microprocessor. In the case where the output driver transistors are very fast devices, their increased switching speed increases the rate at which the current changes. The increased switching speeds of these high-performance devices increases the rate at which the current changes, thereby causing current surges on the power supply lines. The simultaneous operation of the P-channel and N-channel driver transistors, during their transition from one logic state to another, may also contribute to current surges on the power supply lines. These undesirable noise spikes on the power supply lines typically translate to output signal ringing.

One approach to solve these problems is to use additional power supply pins, thereby distributing the current surges over a greater number of pins. This approach is often impractical, due to the additional chip area required for its implementation, and the incremental packaging costs associated with high pin-count packages. Another approach is to reduce the device size in the output buffer, thereby limiting the change in current attributable to the output buffer switching. Generally, this approach adversely affects the speed and ultimately the performance of the microprocessor. Yet another approach is to anticipate the di/dt spike associated with the buffer logic state transition, and incorporate delay circuitry to compensate for the higher di/dt. This approach, disclosed in U.S. Pat. No. 4,758,743, by Dehganpour et al entitled "Output Buffer with Improved Di/Dt" is an improvement but still not optimum.

SUMMARY OF THE INVENTION

An object of the present invention is to provide an improved output buffer.

Another object of the present invention is to provide a high-speed output buffer with improved di/dt control.

Yet another object of the invention is to provide a high-speed buffer requiring reduced chip area.

These and other objects are achieved in an output buffer circuit, comprising a driver, coupled to an output terminal and having an input, for supplying current between a power supply terminal and the output terminal in proportion to a control voltage on the input; a sensor, having an input for receiving the control voltage coupled to the driver, for detecting the current supplied between the output terminal and the power supply terminal by the driver, and providing a feedback voltage proportional thereto; and, a controller, coupled to the driver and the sensor, for receiving a control signal and the feedback voltage and, for providing the control voltage in response thereto.

DESCRIPTION OF THE INVENTION

Figure 1:
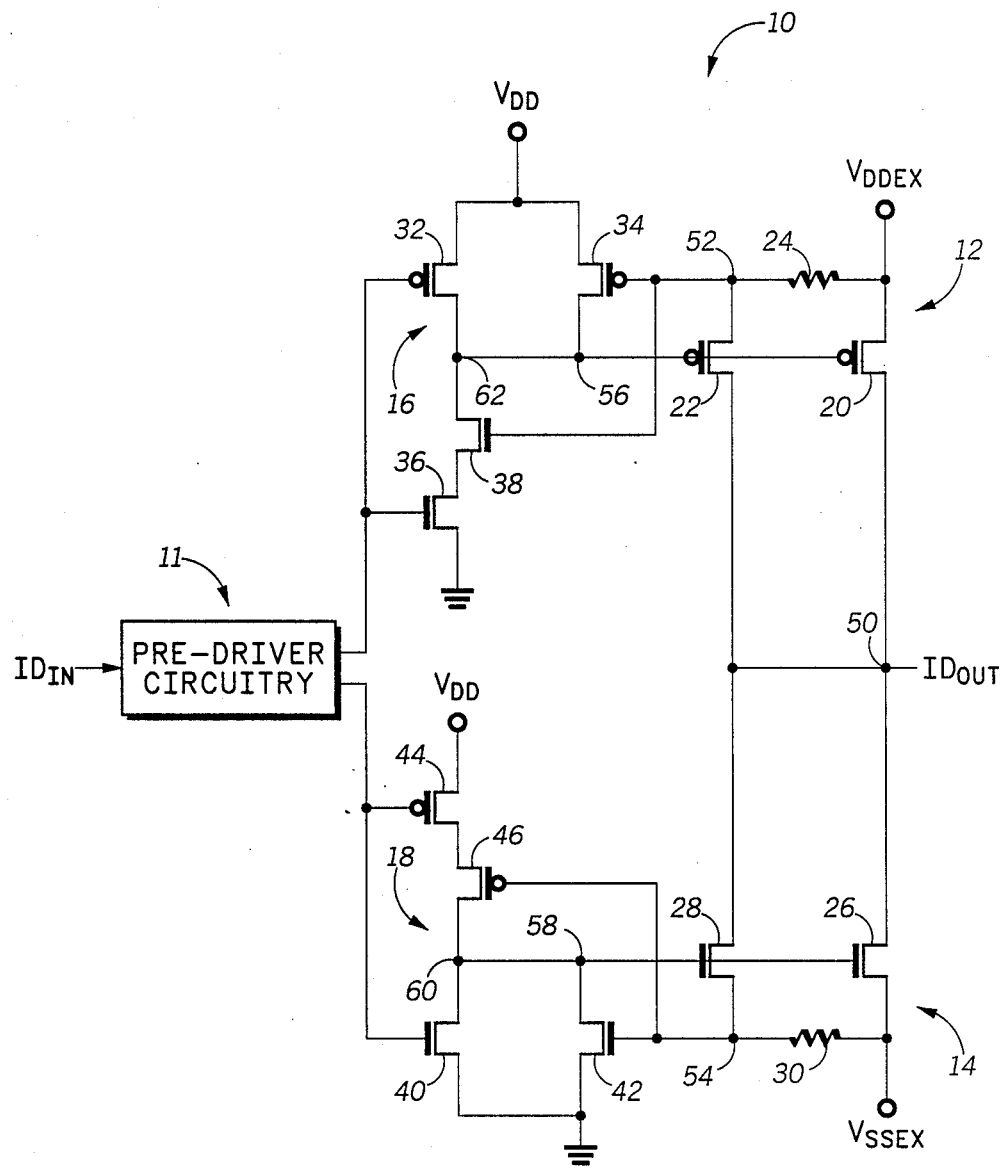
FIG. 1 illustrates, in schematic form, an embodiment of the invention.

Shown in FIG. 1 is an output buffer 10 for use in providing an output signal for an integrated circuit comprised generally of a logic high driver 12, a logic low driver 14, a NAND gate 16, and NOR gate 18. Logic high driver 12 is comprised of a P-channel transistors 20 and 22, and a resistor 24. Logic low driver 14 is comprised of N-channel transistors 26 and 28, and a resistor 30. Output buffer 10 receives an internal data signal $ID_{in}$ from the Pre-Driver Logic Circuitry 11. NAND gate 16 has a first input for receiving a internal data signal $ID_{in}$, a second input for receiving a first feedback voltage, and an output for providing a control voltage to the logic high driver 12. NOR gate 18 has a first input for receiving an internal data signal $ID_{in}$, a second input for receiving a second feedback voltage, and an output for providing a control voltage to the logic low driver 14. Transistor 20 has a source connected to an external positive power supply terminal $V_{DDex}$, a gate connected to the output of NAND gate 16, and a drain connected for providing an output at a node 50. Transistor 22 has a source connected to a node 52, a gate connected to the output of NAND gate 16, and a drain. Resistor 24 has a first terminal connected to $V_{DDex}$, and a second terminal connected to the source of transistor 22. Transistor 26 has a source connected to a external negative power supply terminal $V_{SSex}$, a gate connected to the outut of NOR gate 18, and a drain for providing an output at node 50. Transistor 28 has a source connected to a node 54, a gate connected to the output of NOR gate 18, and a drain. Resistor 30 has a first terminal connected to $V_{SSex}$, and a second terminal connected to the source of transistor 28.

NAND gate 16 provides control for the logic high driver 12 and is comprised of P-channel transistors 32 and 34, and N-channel transistors 36 and 38. Transistor 32 has a source connected to an internal power supply $V_{DD}$, a gate for receiving signal $ID_{in}$, and a drain for providing an output at a node 56. Transistor 34 has a source connected to $V_{DD}$, a gate connected to node 52, and a drain connected to the drain of transistor 32. Transistor 36 has a source connected to a internal negative power supply terminal, shown as ground, a gate connected to the gate of transistor 32, and a drain. Transistor 38 has a source connected to the drain of transistor 36, a gate connected to node 52, and a drain connected to node 56.

NOR gate 18 provides control for the logic low driver 14 and is comprised of N-channel transistor 40 and 42, and P channel transistors 44 and 46. Transistor 40 has a source connected to ground, a gate for receiving input signal $ID_{in}$, and a drain connected for providing an output at node 58. Transistor 42 has a source connected to ground, a gate connected to node 54, and a drain. Transistor 44 has a source connected to $V_{DD}$, a gate for receiving input signal $ID_{in}$, and a drain. Transistor 46 has a source connected to the drain of transistor 44, a gate connected to node 64, and a drain connected to node 58.

Output buffer 10 provides an output signal $ID_{out}$ at the logic level represented by internal data signal $ID_{in}$. In the preferred embodiment, NAND gate 16 and NOR gate 18 control the operation of the logic high driver 14 and logic low driver 16, respectively. The split control mechanisms for P-channel transistors 20 and 22, and N-channel transistors 26 and 28, prevents the simultaneous operation of logic high driver 14 and logic low driver 16, thus reducing the overlap current attributable to their contemporaneous operation.

In the case where signal $ID_{in}$ switches from a logic low to a logic high, transistor 44 becomes non-conductive and transistor 40 becomes conductive. As a result, NOR gate 18 provides a logic low output at node 58, rendering transistors 26 and 28 non-conductive. The gate electrodes of transistors 32 and 36, of NAND gate 16, are coupled to signal $ID_{in}$. Thus, the transition of signal $ID_{in}$ from a logic low to a logic high causes transistor 32 to become non-conductive, and transistor 36 becomes conductive. Node 52 at a logic high causes transistor 34 to be non-conductive, and transistor 38 to be conductive. Transistors 34 and 36 conduct, thereby providing a low level at node 62. Since the output of NAND gate 16 is a logic low, transistors 20 and 22 become conductive. A current path from the external power supply $V_{DDex}$ through transistor 22 creates a voltage drop across resistor 24. The voltage drop across resistor 24 causes a reduction in voltage at node 52, creating a negative feedback path into the control circuit, NAND gate 16. If the voltage across resistor 24 exceeds the transition region (threshold voltage) for a logic high, node 52 will provide a low-level input to NAND gate 16, which in turn will cause transistor 34 to become conductive and transistor 38 non-conductive. The voltage at node 56 will begin to increase, thus reducing the current drive capabilities of transistors 20 and 22. This process will continue until an equilibrium point is achieved, whereby transistor 22 draws just enough current through resistor 24 to maintain a voltage level at node 56, which will not cause the output of NAND gate 16 to change. Thus, as node 60 rises towards $V_{DD}$, the ringing on the internal power supply bus is minimized, due to the modulation of the current carrying capability of transistors 20 and 22. Accordingly the transition of $ID_{out}$ occurs rapidly, with minimal distortion.

In the case where the transition of the internal data signal $ID_{in}$ is from a logic high to a logic low, transistor 36 becomes non-conductive and transistor 32 conductive. Consequently, NAND gate 16 provides a logic high output at node 56, rendering transistors 20 and 22 non-conductive. The gate electrodes of transistors 40 and 44 are also coupled to signal $ID_{in}$. Thus, the transition of $ID_{in}$ from a logic high to a logic low causes transistor 40 to become non-conductive, and transistor 44 to become conductive. Node 54 at a logic low causes transistor 46 to become conductive and transistor 42 non-conductive. Accordingly, transistors 44 and 46 conduct, thereby providing a logic high at node 60. Since the output of NOR gate 18 is a logic high, transistors 26 and 28 become conductive, discharging the capacitance at output node 50. The current flowing through transistor 28 and resistor 30 causes a voltage drop across resistor 30. This voltage drop results in an increase in voltage at node 54, which is an input to NOR gate 18. IF the voltage drop across resistor 30 exceeds the transition voltage for a logic low, node 54 will provide a logic high input to NOR gate 18, which in turn will cause transistor 46 to become non-conductive, and transistor 42 to become conductive. Consequently, the voltage at node 58 will begin to decrease, thus reducing the current drive capabilities of transistors 26 and 28. This process will continue until an equilibrium point is achieved, whereby transistor 28 draws just enough current through resistor 30 to maintain a voltage level at node 54 which will avert the switching of the logic state of NOR gate 18. The noise spikes induced in the supply lines, when output buffer 10 switches, are minimized due to the modulation of the current drive capabilities of transistors 26 and 28. Accordingly, the feedback control provided by transistor 28 and resistor 30 substantially reduces the ground bounce effect, thus facilitating the rapid transition of $ID_{out}$ to the logic low level.

Generally, the power supply line disturbance occurs due to the output buffer drawing excessive amounts of current through the power supply pin. Often, this phenomenon occurs as a result of process variations producing transistors with lower threshold voltages. The lower threshold voltage of these resistors causes them to conduct current faster. In the preferred embodiment, the size of transistors 22 and 28, and resistors 24 and 30 determines the current drive capabilities of driver transistors 20 and 26. Essentially, transistor 22 and resistor 24 comprise a sensing circuit, which is designed to detect the amount of capacitance on the output node 50, when the output buffer 10 is driving the output signal $ID_{out}$ high. Similarly, transistor 28 and resistor 30 comprise a sensing circuit for detecting the amount of capacitance on the output node 50, when the output buffer 10 is driving output signal $ID_{out}$ low. Proper selection of the sizes of transistor 22 and resistor 24 permits the reduction of the gate drive on transistor 20 and 22, due to the feedback path into control mechanism, in cases where those devices are very strong. Since output buffer 10 functions in a symmetrical and analogous manner when driving the output to a logic low level, the proper selection of the sizes of transistor 28 and resistor 30 also permits the reduction of the gate drive on transistors 26 and 28. Summarily, the sensing circuitry of output buffer 10 detects whether the output devices (transistors 20,22, 26 and 28) are strong, and rapidly produces a control voltage to slow the output rise time, thus limiting the di/dt. The reduction of the gate drive on transistors 20 and 22 does not occur when those devices are weak, since transistor 22 draws insufficient current through resistor 24 to cause a significant voltage drop at node 52. This applies equally for transistor 26 and 28, in the case of the logic low driver 14. Consequently, in worst case processing the speed penalty imposed by the output buffer 10 is minimal.

While the invention has been described in a particular embodiment, it will be apparent to those skilled in the art that the disclosed invention may be practiced in numerous ways, and may assume many embodiments other than that specifically set out and described above. Accordingly, it is intended by the appended claims to cover all modifications of the invention which fall within the true spirit and scope of the invention.

We claim:

1. An output buffer circuit, comprising:
   driver means, coupled to an output terminal and having an input, for supplying current between a first power supply terminal and said output terminal in proportion to a control voltage on said input;
   sensing means, having an input, coupled to the input for said driver means, for receiving said control voltage, for detecting the current supplied between said output terminal and said first power supply terminal by said driver means, and proving a feedback voltage proportional thereto;
   input means for providing the control voltage in response to a data signal;
   control means, coupled to said driver means, said input means, and said sensing means, for receiving said feedback voltage, and for modulating said control voltage in response thereto.

2. The output buffer of claim 1 wherein the driver means comprises:
   a first transistor having a control electrode for receiving the control voltage, a first current electrode coupled to the first power supply terminal, and a second current electrode coupled to the output terminal.

3. The output buffer of claim 2 wherein the sensing means comprises:
   a second transistor having a control electrode coupled to the control electrode of the first transistor, a first current electrode coupled to the control means, and a second current electrode coupled to the output terminal; and
   a first resistor with a first terminal coupled to the first current electrode of the first transistor, and a second terminal coupled to the first current electrode of the second transistor.

4. The output buffer circuit of claim 3 wherein the control means comprises:
   a third transistor having a control electrode for receiving the feedback voltage, a first current electrode coupled to the first power supply terminal, and a second current electrode coupled to the control electrode of the second transistor;
   a fourth transistor having a control electrode for receiving the feedback voltage, a first current electrode connected to the input means, and a second current electrode; and
   a fifth transistor having a control electrode for receiving the data signal, a first current electrode coupled to the second current electrode of the second current electrode of the fourth transistor, and a second current electrode coupled to a second power supply terminal.

5. An output buffer circuit, comprising:
   a first transistor having a control electrode, a first current electrode coupled to a first power supply terminal, and a second current electrode;
   a second transistor having a control electrode, a first current electrode coupled to the second current electrode of the first transistor, and a second current electrode coupled to a second power supply terminal;
   a third transistor having a control electrode coupled to the control electrode of the first transistor, a first current electrode coupled to a first node, and a second current electrode coupled to a second node for providing an output;
   a fourth transistor having a control electrode coupled to the control electrode of the second transistor, a first current electrode coupled to the second node, and a third current electrode coupled to a third node;
   a fifth transistor having a control electrode coupled to the first node, a first current electrode coupled to a third power supply terminal, and a second current electrode coupled to a fourth node;
   a sixth transistor having a control electrode for receiving a first input signal, a first current electrode connected to the third power supply terminal, and a second current electrode coupled to the fourth node;
   a seventh transistor having a control electrode coupled to the control electrode of the fifth transistor, a first current electrode coupled to the fourth node, and a second current electrode;
   an eighth transistor having a control electrode coupled to the control electrode of the sixth transistor, a first current electrode coupled to the second control electrode of the seventh transistor, and a second current electrode coupled to a fourth power supply terminal;
   a ninth transistor having a control electrode coupled to the third node, a first current electrode coupled to a fifth node, and a second current electrode coupled to a fifth power supply terminal;
   a tenth transistor having a control electrode for receiving a second input signal, a first current electrode coupled to the fifth node, and a second current electrode coupled to the fifth power supply terminal;
   an eleventh transistor having a control electrode coupled to the third node, a first current electrode, and a second current electrode coupled to the fifth node;
   a twelfth transistor having a control electrode coupled to the control electrode of the tenth transistor, a first current electrode coupled to a sixth power supply terminal, and a second current electrode coupled to the first current electrode of the eleventh transistor;

a first resistor with a first terminal connected to the first current electrode of the first transistor, and a second terminal connected to the first node; and a second resistor with a first terminal connected to the second current electrode of the second transistor, and a second terminal connected to the third node.

6. An output buffer circuit, comprising:

driver means, coupled to an output terminal and having an input, for supplying current between a first power supply terminal and said output terminal in proportion to a control voltage on said input, said driver means comprising:
- a first transistor having a control electrode for receiving the control voltage, a first current electrode coupled to the first power supply terminal, and a second current electrode coupled to the output terminal; and sensing means, having an input, coupled to the input for said driver means, for receiving said control voltage, for detecting the current supplied between said output terminal and said first power supply terminal by said driver means, and providing a feedback voltage proportional thereto, said sensing means comprising:
- a second transistor having a control electrode coupled to the control electrode of the first transistor, a first current electrode and a second current electrode coupled to the output terminal; and
- a first resistor with a first terminal coupled to the first current electrode of the first transistor, and a second terminal coupled to the first current electrode of the second transistor;

input means for providing the control voltage in response to a data signal comprising a third transistor having a control electrode for receiving said data signal, a first current electrode coupled to the first power supply terminal, and a second current electrode coupled to the control electrode of the second transistor;

control means, coupled to said first current electrode of said second transistor, said driver means, said input means, and said sensing means, for receiving said feedback voltage, and for modulating said control voltage in response thereto, said control means comprising:
- a fourth transistor having a control electrode for receiving the feedback voltage, a first current electrode coupled to the first power supply terminal, and a second current electrode coupled to the control electrode of the second transistor;
- a fifth transistor having a control electrode for receiving the feedback voltage, a first current electrode connected to the input means, and a second current electrode; and
- a sixth transistor having a control electrode for receiving the data signal, a first current electrode coupled to the second current electrode of the fifth transistor, and a second current electrode coupled to a second power supply.

7. The output buffer of claim 6 further comprising:

a seventh transistor having a control electrode, a first current electrode coupled to the second power supply terminal, and a second current electrode coupled to the output terminal;

an eighth transistor having a control electrode coupled to the control electrode of the seventh transistor, a first current electrode coupled to a second node, and a second current electrode coupled to the output terminal;

a ninth transistor having a control electrode coupled to the second node, a first current electrode coupled to the second power supply terminal, and a second current electrode coupled to the control electrode of the eighth transistor;

a tenth transistor having a control electrode for receiving the first input signal, a first current electrode coupled to the first current electrode of the ninth transistor, and a second current electrode coupled to the control electrode of the eighth transistor;

an eleventh transistor having a control electrode coupled to the control electrode of the ninth transistor, a first current electrode coupled to the control electrode of the eighth transistor, and a second control electrode;

a twelfth transistor having a control electrode for receiving the first input signal, a first current electrode coupled to the first power supply terminal, and a second current electrode coupled to the second current electrode of the eleventh transistor; and a second resistor with a first terminal coupled to the first current electrode of the seventh transistor, and a second terminal coupled to the first current electrode of the eighth transistor.

8. An output buffer circuit, comprising:

a first transistor having a control electrode, a first current electrode coupled to a first power supply terminal, and a second current electrode coupled to an output terminal for providing an output signal;

a second transistor having a control electrode coupled to the control electrode of the first transistor, a first current electrode coupled to a first node, and a second current electrode coupled to the output terminal;

a third transistor having a control electrode coupled to the first node, a first current electrode coupled to the first power supply terminal, and a second current electrode coupled to the control electrode of the second transistor;

a fourth transistor having a control electrode for receiving a first input signal, a first current electrode connected to the first power supply terminal, and a second current electrode coupled to the control electrode of the second transistor;

a fifth transistor having a control electrode coupled to the control electrode of the third transistor, a first current electrode coupled to the the control electrode of the second transistor, and a second current electrode;

an sixth transistor having a control electrode coupled to the control electrode of the fourth transistor, a first current electrode coupled to the second current electrode of the third transistor, and a second current electrode coupled to a second power supply terminal;

a first resistor with a first terminal connected to the first current electrode of the first transistor, and a second terminal connected to the first node.

9. The output buffer of claim 8 further comprising:

a seventh transistor having a control electrode, a first current electrode coupled to the second power supply terminal, and a second current electrode coupled to the output terminal;

an eighth transistor having a control electrode coupled to the control electrode of the seventh transistor, a first current electrode coupled to a second node, and a second current electrode coupled to the output terminal;

a ninth transistor having a control electrode coupled to the second node, a first current electrode coupled to the second power supply terminal, and a second current electrode coupled to the control electrode of the eighth transistor;

a tenth transistor having a control electrode for receiving the first input signal, a first current electrode coupled to the first current electrode of the ninth transistor, and a second current electrode coupled to the control electrode of the eighth transistor;

an eleventh twelfth transistor having a control electrode coupled to the control electrode of the ninth transistor, a first current electrode coupled to the control electrode of the eighth transistor, and a second control electrode;

a twelfth transistor having a control electrode for receiving the first input signal, a first current electrode coupled to the first power supply terminal, and a second current electrode coupled to the second current electrode of the eleventh transistor; and a second resistor with a first terminal coupled to the first current electrode of the seventh transistor, and a second terminal coupled to the first current electrode of the eighth transistor.

* * * * *

UNITED STATES PATENT AND TRADEMARK OFFICE
CERTIFICATE OF CORRECTION

PATENT NO. : 4,959,561

DATED : September 25, 1990

INVENTOR(S) : Mark W. McDermott and Ernest A. Carter

It is certified that error appears in the above-identified patent and that said Letters Patent is hereby corrected as shown below:

Column 5, line 36, change "proving" to --providing--

Column 6, line 7, delete [second current electrode of the]

Column 10, line 1, delete [twelfth]

Signed and Sealed this

Twenty-eighth Day of April, 1992

Attest:

HARRY F. MANBECK, JR.

Attesting Officer          Commissioner of Patents and Trademarks